US012596206B2

(12) United States Patent
Kim et al.

(10) Patent No.: US 12,596,206 B2
(45) Date of Patent: Apr. 7, 2026

(54) ELECTRONIC DEVICE

(71) Applicant: Samsung Display Co., Ltd., Yongin-si (KR)

(72) Inventors: Byoungki Kim, Seoul (KR); Do-Hyuk Kwon, Cheonan-si (KR); Yousik Shin, Suwon-si (KR); Gak Seok Lee, Hwaseong-si (KR); Kyunghwan Jeon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 736 days.

(21) Appl. No.: 17/946,619

(22) Filed: Sep. 16, 2022

(65) Prior Publication Data

US 2023/0171992 A1      Jun. 1, 2023

(30) Foreign Application Priority Data

Nov. 29, 2021      (KR) ......................... 10-2021-0167579

(51) Int. Cl.
*G02B 1/115* (2015.01)
*H10K 59/38* (2023.01)

(52) U.S. Cl.
CPC .............. *G02B 1/115* (2013.01); *H10K 59/38* (2023.02)

(58) Field of Classification Search
CPC .................................. G02B 1/115; G02B 1/11
See application file for complete search history.

(56) References Cited

U.S. PATENT DOCUMENTS

| | | | |
|---|---|---|---|
| 9,606,267 B2 | 3/2017 | Yang et al. | |
| 10,923,539 B2 | 2/2021 | Bok | |
| 2002/0127408 A1* | 9/2002 | Nishida ................... G02B 1/111 |
| | | | 428/432 |
| 2006/0269731 A1* | 11/2006 | Yoshikawa ....... B32B 17/10018 |
| | | | 359/359 |
| 2010/0208350 A1 | 8/2010 | Yoshihara | |
| 2015/0085201 A1* | 3/2015 | Chen ..................... G06F 3/0448 |
| | | | 349/12 |

(Continued)

FOREIGN PATENT DOCUMENTS

| | | |
|---|---|---|
| JP | 2004287392 | 10/2004 |
| JP | 2010072039 | 4/2010 |

(Continued)

OTHER PUBLICATIONS

"Optical Coatings." www.thorlabs.com, www.thorlabs.com/newgrouppage9.cfm?objectgroup_id=5840. (Year: 2020).*

*Primary Examiner* — George G. King
*Assistant Examiner* — Natasha Nigam
(74) *Attorney, Agent, or Firm* — CANTOR COLBURN LLP

(57)      ABSTRACT

Provided is an electronic device including a display module, and an anti-reflection member disposed on the display module and having an SCI reflectance in a range of about 4% to about 7% with respect to light having a wavelength in a range of about 350 nm to about 370 nm. The anti-reflection member includes a base layer, a hard coating layer disposed on the base layer, a first optical layer disposed on the hard coating layer and having a first refractive index, and a second optical layer disposed on the first optical layer and having a second refractive index that is smaller than the first refractive index.

15 Claims, 12 Drawing Sheets

(56)  References Cited

U.S. PATENT DOCUMENTS

| | | | | |
|---|---|---|---|---|
| 2015/0301231 A1* | 10/2015 | Yang | ......................... | G02B 1/14 |
| | | | | 428/313.9 |
| 2019/0204485 A1* | 7/2019 | Jung | ...................... | G02B 5/305 |
| 2020/0083303 A1* | 3/2020 | Bok | ................... | H10K 59/8792 |
| 2021/0223438 A1* | 7/2021 | Baek | ......................... | G02B 1/14 |

FOREIGN PATENT DOCUMENTS

| | | | |
|---|---|---|---|
| JP | 2013122516 A | 6/2013 |
| JP | 2014232279 A | 12/2014 |
| KR | 10-2014-0065250 | 5/2014 |
| KR | 20-2015-0001330 | 4/2015 |
| KR | 10-1753879 | 7/2017 |
| KR | 10-1977933 | 8/2019 |
| KR | 10-2020-0029093 | 3/2020 |

* cited by examiner

SCI Reflectance(%)

Wavelength(nm)

SCI Reflectance(%)

Wavelength(nm)

SCE Reflectance(%)

Wavelength(nm)

SCE Reflectance(%)

Wavelength(nm)

SCI Reflectance(%)

Wavelength(nm)

SCI Reflectance(%)

Wavelength(nm)

ELECTRONIC DEVICE

CROSS REFERENCE TO RELATED APPLICATION(S)

This application claims priority to and benefits of Korean Patent Application No. 10-2021-0167579 under 35 U.S.C. § 119, filed on Nov. 29, 2021, in the Korean Intellectual Property Office (KIPO), the disclosure of which is incorporated by reference herein in its entirety.

BACKGROUND

1. Technical Field

The disclosure herein relates to an electronic device including an anti-reflection member.

2. Description of the Related Art

Various electronic devices for providing image information in multimedia devices such as a television, a mobile phone, a tablet computer, a navigation system, and a game console are being developed. In particular, electronic devices, including liquid crystal display elements, organic electroluminescent display elements, and the like, employ quantum dots to improve display quality.

Electronic devices including quantum dots employ an anti-reflection member so as to exhibit improved reflectance characteristics.

SUMMARY

The disclosure provides an electronic device with improved display quality, including an anti-reflection member having high reflectance with respect to short-wavelength light.

An embodiment of the disclosure provides an electronic device that may include: a display module; and an anti-reflection member disposed on the display module, the anti-reflection member having a Specular Component Included (SCI) reflectance in a range of about 4% to about 7% with respect to light having a wavelength in a range of about 350 nm to about 370 nm. The anti-reflection member may include a base layer, a hard coating layer disposed on the base layer, a first optical layer disposed on the hard coating layer, the first optical layer having a first refractive index, and a second optical layer disposed on the first optical layer, the second optical layer having a second refractive index that is smaller than the first refractive index.

In an embodiment, a thickness of the first optical layer may be smaller than a thickness of the second optical layer.

In an embodiment, the first optical layer may have a thickness in a range of about 80 μm to about 90 μm, and the second optical layer may have a thickness in a range of about 90 μm to about 100 μm.

In an embodiment, the first refractive index may be in a range of about 1.4 to about 1.7, and the second refractive index may be in a range of about 1.0 to about 1.3.

In an embodiment, the sum of the thickness of the first optical layer and the thickness of the second optical layer may be in a range of about 170 μm to about 190 μm.

In an embodiment, the anti-reflection member may have an SCI reflectance in a range of about 0% to about 0.3% with respect to light having a wavelength in a range of about 450 nm to about 470 nm.

In an embodiment, the anti-reflection member may have an SCI reflectance in a range of about 0% to about 0.2% with respect to light having a wavelength in a range of about 540 nm to about 560 nm.

In an embodiment, the anti-reflection member may have an SCI reflectance in a range of about 0% to about 0.6% with respect to light having a wavelength in a range of about 710 nm to about 730 nm.

In an embodiment, the first optical layer may include zirconium oxide ($ZrO_x$).

In an embodiment, the second optical layer may include hollow silica.

In an embodiment of the disclosure, an electronic device may include: a base substrate; a circuit layer disposed on the base substrate; a light-emitting element layer disposed on the circuit layer; an encapsulation layer disposed on the light-emitting element layer; a light control layer including at least one light control member, the light control layer disposed on the encapsulation layer and the at least one light control member containing quantum dots; a color filter layer disposed on the light control layer; and an anti-reflection member disposed on the light control member, the anti-reflection member having a Specular Component Included (SCI) reflectance in a range of about 4% to about 7% with respect to light having a wavelength in a range of about 350 nm to about 370 nm. The anti-reflection member may include a base layer, a hard coating layer disposed on the base layer, a first optical layer disposed on the hard coating layer, the first optical layer having a first refractive index, and a second optical layer disposed on the first optical layer, the second optical layer having a second refractive index that is smaller than the first refractive index.

In an embodiment, the first refractive index may be in a range of about 1.4 to about 1.7, and the second refractive index may be in a range of about 1.0 to about 1.3.

In an embodiment, a thickness of the first optical layer may be smaller than a thickness of the second optical layer, the first optical layer may have the thickness in a range of about 80 μm to about 90 μm, and the second optical layer may have the thickness in a range of about 90 μm to about 100 μm.

In an embodiment, the first optical layer may include zirconium oxide ($ZrO_x$), and the second optical layer may include hollow silica.

In an embodiment, the anti-reflection member may have an SCI reflectance in a range of about 0% to about 0.3% with respect to light having a wavelength in a range of about 450 nm to about 470 nm.

In an embodiment, the anti-reflection member may have an SCI reflectance in a range of about 0% to about 0.2% with respect to light having a wavelength in a range of about 540 nm to about 560 nm.

In an embodiment, the anti-reflection member may have an SCI reflectance in a range of about 0% to about 0.6% with respect to light having a wavelength in a range of about 710 nm to about 730 nm.

In an embodiment, the light-emitting element layer may include a first electrode, a hole transport region, a light-emitting layer, an electron transport region, and a second electrode that are sequentially stacked each other.

In an embodiment, the light-emitting layer may emit blue light.

In an embodiment, the light control layer may include: a first light control member that converts the blue light into red light; a second light control member that converts the blue light into green light; and a third light control member that transmits the blue light.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 4 is a schematic cross-sectional view of a display device according to an embodiment;

FIG. 7 is a schematic cross-sectional view of a display device according to an embodiment;

DETAILED DESCRIPTION OF THE EMBODIMENTS

Figure 1:
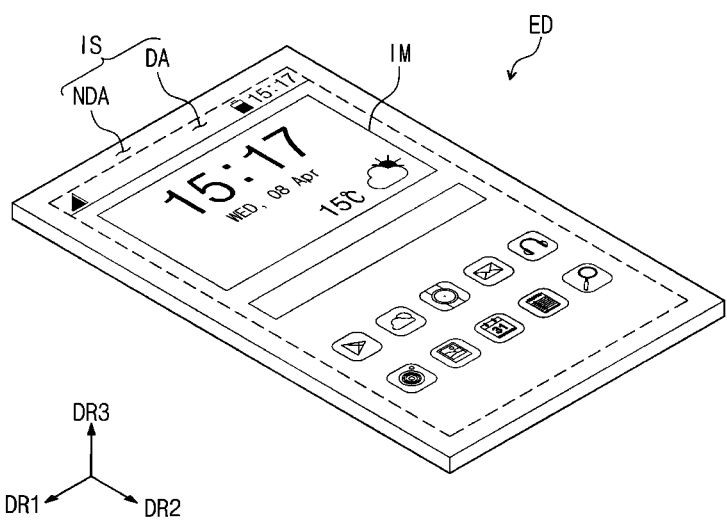
FIG. 1 is a perspective view illustrating an electronic device according to an embodiment.

Hereinafter, embodiments of the disclosure will be described with reference to the accompanying drawings.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like reference numerals or symbols refer to like elements throughout. The thickness and the ratio and the dimension of the element are exaggerated for effective description of the technical contents. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an electronic device according to an embodiment of the disclosure will be described with reference to the accompanying drawings.

Figure 2:
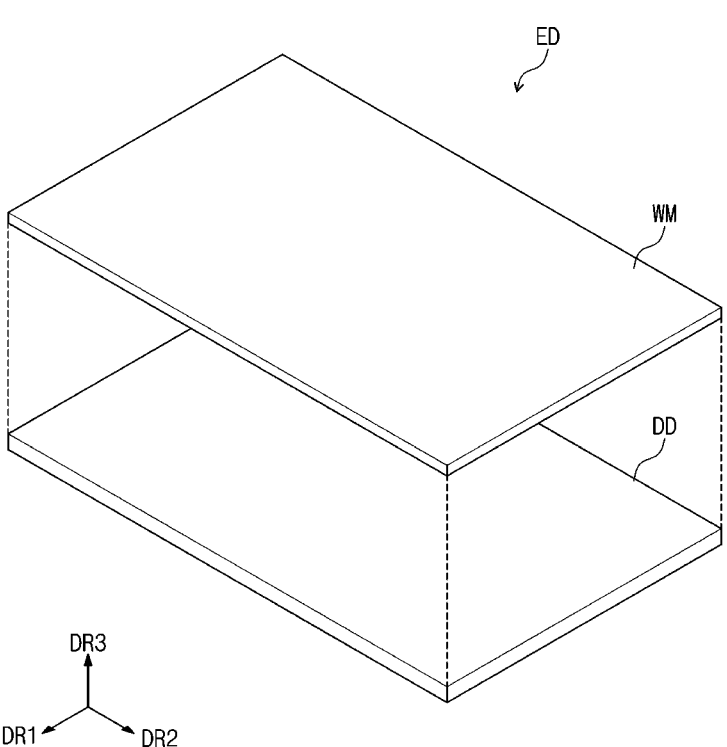
FIG. 2 is an exploded perspective view of an electronic device according to an embodiment.

FIG. 1 is a perspective view illustrating an electronic device according to an embodiment. FIG. 2 is an exploded perspective view of an electronic device according to an embodiment.

Referring to FIG. 1, an electronic device ED may display an image IM through a display surface IS. The display surface IS may include a display region DA in which an image IM is displayed, and a non-display region NDA adjacent to the display region DA. The non-display region NDA may be a region in which an image is not displayed.

The display region DA may have a rectangular shape. The non-display region NDA may surround the display region DA. However, an embodiment of the disclosure is not limited thereto, and the shape of the display region DA and the shape of the non-display region NDA may be relatively designed. The non-display region NDA may not exist on the entire surface of the display device DD.

FIG. 1 illustrates a portable electronic apparatus as an electronic device ED. However, the electronic device ED may be used in a large electronic device such as a television, a monitor, or an external billboard, and also a small- and medium-sized electronic device such as a personal computer, a notebook computer, a personal digital terminal, a car navigation unit, a game machine, a smartphone, a tablet, or a camera. These are presented only as examples, and the electronic device EA may also be used in other electronic apparatuses without departing from the disclosure.

Referring to FIG. 2, an electronic device ED according to an embodiment may include a display device DD and a window WM disposed on the display device DD. The display device DD may generate an image. The display device DD will be described in detail later.

The window WM may include an optically transparent insulating material. The window WM may be flexible. For example, the window WM may include a resin film such as polyimide, a resin substrate, or a thin-film glass substrate. The image generated by the display device DD may be displayed on the electronic device ED through the window WM.

Figure 3:
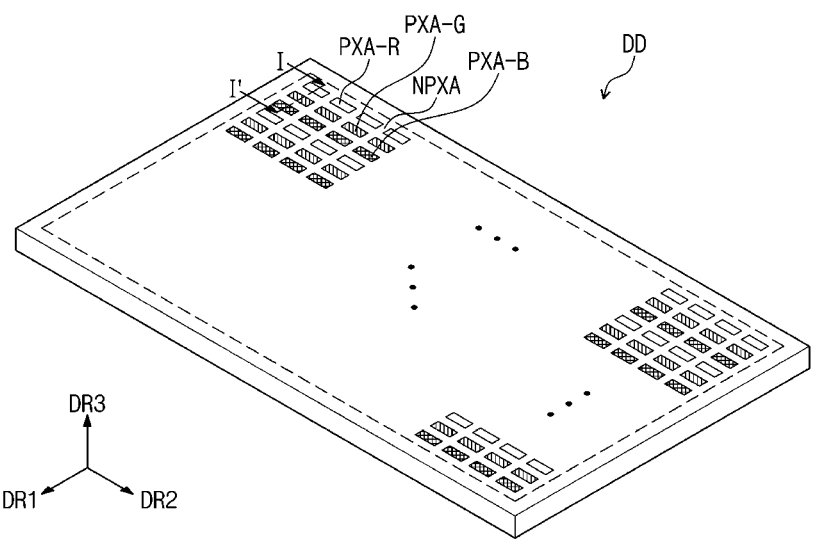
FIG. 3 is a perspective view of a display device according to an embodiment.
Figure 4:
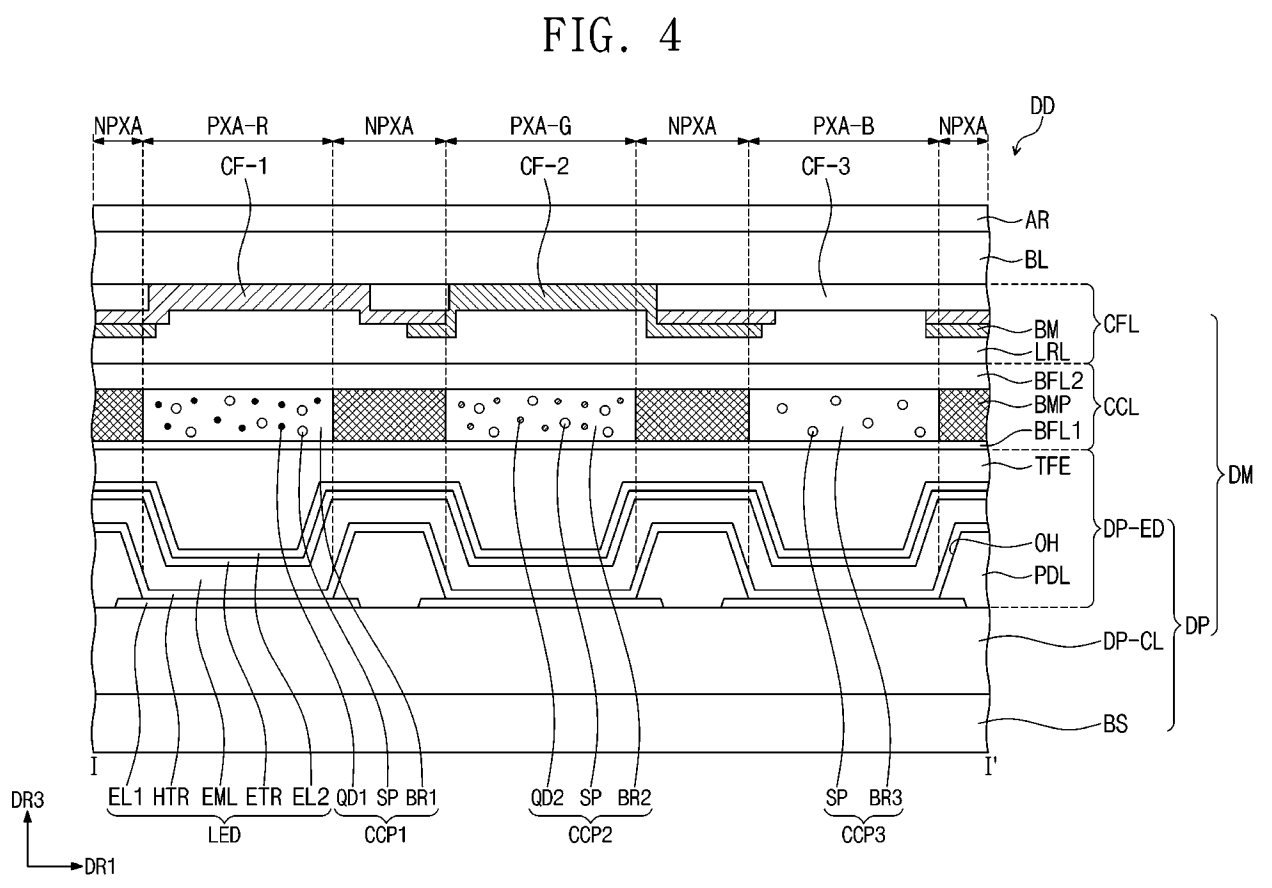

FIG. 3 is a perspective view of a display device according to an embodiment. FIG. 4 is a schematic cross-sectional view of a display device according to an embodiment. FIG. 4 may be a schematic cross-sectional view taken along line I-I' of FIG. 3.

Referring to FIGS. 3 and 4, a display device DD according to an embodiment may include a display module DM and an anti-reflection member AR disposed on the display module DM. The display device DD according to an embodiment may further include a base substrate BL disposed between the display module DM and the anti-reflection member AR.

The display module DM may include a display panel DP, a light control layer CCL, and a color filter layer CFL that are sequentially stacked each other. The display panel DP may include a panel base layer BS, a circuit layer DP-CL provided on the panel base layer BS, and a display element layer DP-ED. The display element layer DP-ED may include pixel defining films PDL, light-emitting elements LED disposed between the pixel defining films PDL, and an encapsulation layer TFE disposed on the light-emitting elements LED.

The panel base layer BS may be a member that provides a base surface on which the display element layer DP-ED is disposed. The panel base layer BS may be a glass substrate, a metal substrate, a plastic substrate, or the like. However, an embodiment of the disclosure is not limited thereto, and the panel base layer BS may be an inorganic layer, an organic layer, or a composite material layer.

In an embodiment, the circuit layer DP-CL may be disposed on the panel base layer BS, and may include multiple transistors (not shown). The transistors (not shown) may each include a control electrode, an input electrode, and an output electrode. For example, the circuit layer DP-CL may include a switching transistor and a driving transistor for driving the light-emitting elements LED of the display element layer DP-ED.

Each of the light-emitting elements LED may include a first electrode EL1, a hole transport region HTR, a light-emitting layer EML, an electron transport region ETR, and a second electrode EL2. The hole transport region HTR, the light-emitting layer EML, the electron transport region ETR, and the second electrode EL2 may be provided as common layers in all of the light-emitting elements LED. The light-emitting elements LED may emit first color light of a single wavelength range. For example, the first color light emitted by the light-emitting elements LED may be blue light.

Unlike the configuration illustrated, the hole transport region HTR, the light-emitting layer EML, and the electron transport region ETR may be provided by being patterned inside of the openings OH defined in the pixel defining films PDL. For example, in an embodiment, the hole transport region HTR, the light-emitting layer EML, and the electron transport region ETR of the light-emitting element LED may be provided by being patterned by an inkjet printing method. In case that light-emitting layer EML is provided by patterning, each of the patterned light-emitting layers EML may emit first color light having the same wavelength range. The first color light may be blue light.

The encapsulation layer TFE may cover the light-emitting elements LED. The encapsulation layer TFE may seal the display element layer DP-ED. The encapsulation layer TFE may be a thin film encapsulation layer. The encapsulation layer TFE may be a single layer or a stack of multiple layers. The encapsulation layer TFE may include at least one insulating layer. The encapsulation layer TFE according to an embodiment may include at least one inorganic film (hereinafter, an inorganic encapsulation film). The encapsulation layer TFE according to an embodiment may include at least one organic film (hereinafter, an organic encapsulation film) and at least one inorganic encapsulation film.

The inorganic encapsulation film may protect the display element layer DP-ED from moisture or oxygen, and the organic encapsulation film may protect the display device layer DP-ED from foreign substances such as dust particles. The inorganic encapsulation film may include silicon nitride, silicon oxynitride, silicon oxide, titanium oxide, aluminum oxide, or the like, but is not particularly limited thereto. The organic encapsulation film may include an acrylic compound, an epoxy-based compound, or the like. The organic encapsulation film may include a photopolymerizable organic material, but is not particularly limited.

The encapsulation layer TFE may be disposed on the second electrode EL2, and may be disposed to fill the openings OH.

The light control layer CCL may be disposed on the display panel DP. The light control layer CCL may include a light converter. The light converter may be a quantum dot, a phosphor, or the like. The light converter may wavelength-convert the provided light and emit the wavelength-converted light. For example, the light control layer CCL may be a layer including a quantum dot or a layer including a phosphor.

The light control layer CCL may include multiple light control members CCP1, CCP2, and CCP3. The light control members CCP1, CCP2, and CCP3 may be separated from each other.

Referring to FIG. 4, partition patterns BMP may be disposed between the separated light control members CCP1, CCP2 and CCP3, but an embodiment of the disclosure is not limited thereto. FIG. 4 illustrates that the partition patterns BMP do not overlap the light control members CCP1, CCP2 and CCP3, but the edges of the light control members CCP1, CCP2 and CCP3 may at least partially overlap the partition patterns BMP.

The light control layer CCL may include a first light control member CCP1 including a first quantum dot QD that converts first color light provided from the light-emitting element ED into second color light, a second light control member CCP2 including a second quantum dot QD2 that converts first color light into third color light, and a third light control member CCP3 that transmits the first color light.

In an embodiment, the first light control member CCP1 may provide red light which may be the second color light, and the second light control member CCP2 may provide green light which may be the third color light. The third light control member CCP3 may transmit blue light which may be the first color light provided from the light-emitting element ED. For example, the first quantum dot QD1 may be a red quantum dot, and the second quantum dot QD2 may be a green quantum dot.

A core of each of the first quantum dot QD1 and the second quantum dot QD2 may be selected from a II-VI group compound, a III-VI group compound, a I-III-VI group compound, a III-V group compound, a III-II-V group compound, a I IV-VI group compound, a IV group element, a IV group compound, and combinations thereof.

The group II-VI compound may be selected from the group of: a binary compound selected from the group of CdSe, CdTe, CdS, ZnS, ZnSe, ZnTe, ZnO, HgS, HgSe, HgTe, MgSe, MgS, and a mixture thereof; a ternary compound selected from the group of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The III-VI group compound may include a binary compound such as $In_2S_3$ and $In_2Se_3$, a ternary compound such as $InGaS_3$ and $InGaSe_3$, or any combination thereof.

The I-III-VI group compound may be selected from the group of a ternary compound selected from the group of AgInS, $AgInS_2$, CuInS, $CuInS_2$, $AgGaS_2$, $CuGaS_2$ $CuGaO_2$, $AgGaO_2$, $AgAlO_2$ and mixtures thereof, and a quaternary compound such as $AgInGaS_2$ and $CuInGaS_2$, or the like.

The group III-V compound may be selected from the group of: a binary compound selected from the group of GaN, GaP, GaAs, GaSb, AlN, AlP, AlAs, AlSb, InN, InP, InAs, InSb, and a mixture thereof; a ternary compound selected from the group of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal. For example, InZnP or the like may be selected as the group III-II-V compound.

The group IV-VI compound may be selected from the group of: a binary compound selected from the group of SnS, SnSe, SnTe, PbS, PbSe, PbTe, and a mixture thereof; a ternary compound selected from the group of SnSeS, SnSeTe, SnSTe, PbSeS, PbSeTe, PbSTe, SnPbS, SnPbSe, SnPbTe, and a mixture thereof; and a quaternary compound selected from the group of SnPbSSe, SnPbSeTe, SnPbSTe, and a mixture thereof. The group IV element may be selected from the group of Si, Ge, and a mixture thereof. The group IV compound may be a binary compound selected from the group of SiC, SiGe, and a mixture thereof.

The binary compound, the ternary compound, or the quaternary compound may be present in the particle with a uniform concentration, or may be present in the same particle with partially different concentration distributions. The binary compound, the ternary compound, or the quaternary compound may have a core or shell structure in which one quantum dot surrounds another quantum dot. The core or shell structure may have a concentration gradient in which the concentration of an element presents in the shell decreases toward the center thereof.

In embodiments, the first quantum dot QD1 and the second quantum dot QD2 may each have a core-shell structure that includes a core having the above-described nanocrystals and a shell surrounding the core. The shells of the first quantum dot QD1 and the second quantum dot QD2 may serve as a protective layer for maintaining semiconductor properties by preventing chemical modification of the cores of the first quantum dot QD1 and the second quantum dot QD2, and/or serve as a charging layer for imparting electrophoretic properties to the quantum dot. The shell of each of the first quantum dot QD1 and the second quantum dot QD2 may have a single layer or multilayer. The shell of the quantum dot may include a metal or non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but an embodiment of the disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the disclosure is not limited thereto.

The first quantum dot QD1 and the second quantum dot QD2 may have a full width of half maximum (FWHM) of emission wavelength spectrum of about 45 nm or less, about 40 nm or less, or about 30 nm or less, and within this range, color purity or color reproducibility may be improved. Light emitted through the first quantum dot QD1 and the second quantum dot QD2 may be emitted in all directions, so that wide viewing angle characteristics may be improved.

The shape of the first quantum dot QD1 and the second quantum dot QD2 is not particularly limited to a shape commonly used in the field, but the quantum dot may have a shape such as a spherical shape, a pyramidal shape, a multi-arm shape, or a cubic nanoparticle, a nanotube, a nanowire, a nanofiber, and a nanoplatelet particle.

The light control layer CCL may further include a scatterer SP. The first light control member CCP1 may include the first quantum dot QD1 and the scatterer SP, the second light control member CCP2 may include the second quantum dot QD2 and the scatterer SP, and the third light control member CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control member CCP1, the second light control member CCP2, and the third light control member CCP3 may respectively include base resins BR1, BR2 and BR3 for dispersing the quantum dots QD1 and QD2 and the scatterer SP. In an embodiment, the first light control member CCP1 may include the first quantum dot QD1 and the scatterer SP which are dispersed in the first base resin BR1, the second light control member CCP2 may include the second quantum dot QD2 and the scatterer SP which are dispersed in the second base resin BR2, and the third light control member CCP3 may include the scatterer SP which is dispersed in the third base resin BR3. The base resins BR1, BR2 and BR3 may be mediums in which the quantum dots QD1 and QD2 and the scatterer SP are dispersed, and may be formed of various resin compositions which may be generally referred to as a binder. For example, the base resins BR1, BR2 and BR3 may be acrylic resins, urethane-based resins, silicone-based resins, or epoxy-based resins, etc. The base resins BR1, BR2 and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to block the moisture and/or oxygen (hereinafter, referred to as "moisture or oxygen"). The barrier layer BFL1 may be disposed on the light control members CCP1, CCP2 and CCP3 to block the light control members CCP1, CCP2 and CCP3 from being exposed to moisture or oxygen. The barrier layer BFL1 may cover the light control members CCP1, CCP2 and CCP3. The barrier layer BFL2 may also be provided between the light control members CCP1, CCP2 and CCP3 and the color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride, or may include a metal thin film with sufficient light transmittance. The barrier layers BFL1 and BFL2 may further include an organic film. The barrier layers BFL1 and BFL2 may be formed of a single layer or multiple layers.

In the display device DD according to an embodiment, the color filter layer CFL may be disposed on the light control layer CCL. For example, the color filter layer CFL may be disposed directly on the light control layer CCL. The barrier layer BFL2 may be omitted.

A low refractive layer LRL may be disposed between light control layer CCL and the color filter layer CFL. The low refractive layer LRL may have a lower refractive index than the color filter layer CFL and the light control layer CCL which are adjacent to the low refractive layer LRL. The low refractive layer LRL may totally reflect portion of blue light which is emitted from the light control layer CCL toward the color filter layer CFL, and make the portion of blue light re-incident onto the light control layer CCL. The blue light may be light emitted from the light-emitting element ED. The portion of the blue light may be re-incident onto the first light control member CCP1 or the second light control member CCP2 which is included in the light control layer CCL. As described above, the first light control member CCP1 may convert the re-incident blue light to red light, and the second light control member CCP2 may convert the re-incident blue light to green light. The light efficiency of the display device DD may be improved through such recirculation of light.

The color filter layer CFL may include a first filter CF-1, a second filter CF-2, and a third filter CF-3. The first filter CF-1 may transmit the second color light, and the second filter CF-2 may transmit the third color light, and the third filter CF-3 may transmit the first color light. For example, the first filter CF-1 may be a red filter, the second filter CF-2 may be a green filter, and the third filter CF-3 may be a blue filter.

The first filter CF-1 may be provided in a red light-emitting region PXA-R and the non-light-emitting region NPXA, and the second filter CF-2 may be provided in a green light-emitting region PXA-G and the non-light-emitting region NPXA. The third filter CF-3 may be provided in a blue light-emitting region PXA-B and the non-light-emitting region NPXA. In the non-light-emitting region NPXA, at least two filters among the first to third filters CF-1, CF-2, and CF-3 may overlap each other. For example, in the non-light-emitting region NPXA, all of the first to third filters CF-1, CF-2, and CF-3 may overlap. However, an embodiment of the disclosure is not limited thereto, and the first to third filters may not be provided in the non-light-emitting region, and a black matrix including an organic insulating material or inorganic insulating material may be provided in the non-light-emitting region.

Each of the first to third filters CF-1, CF-2, and CF-3 may include a polymer photosensitive resin and a pigment or dye. However, an embodiment of the disclosure is not limited thereto, and the third filter CF-3 may not include a pigment or dye. The third filter CF-3 may be transparent. The first filter CF-1 and the second filter CF-2 may be yellow filters. The first filter CF-1 and the second filter CF-2 may be not separated from each other and may be integral each other. A base substrate BL may be disposed on the color filter layer CFL. The base substrate BL may be a member that provides a base surface on which the color filter layer CFL, the light control layer CCL, and the like are disposed. The base substrate BL may be a glass substrate, a metal substrate, a plastic substrate, or the like. However, an embodiment of the disclosure is not limited thereto, and the base substrate BL may be an inorganic layer, an organic layer, or a composite material layer. Unlike the configuration illustrated, the base substrate BL may be omitted in an embodiment.

The display device DD may include a non-light-emitting region NPXA and light-emitting regions PXA-R, PXA-G, and PXA-B. The light-emitting regions PXA-R, PXA-G, and PXA-B may be respectively regions that emit the first to third color light obtained by converting, through the light control layer CCL, the first color light generated by each of the light-emitting elements LED. The light-emitting regions PXA-R, PXA-G, and PXA-B may be spaced apart from each other on a plane.

The light-emitting regions PXA-R, PXA-G, and PXA-B may be divided by the pixel defining films PDL. The non-light-emitting regions NPXA may be located between neighboring light-emitting regions PXA-B, PXA-G, and PXA-R, and may correspond to the pixel defining films PDL. In the specification, the light-emitting regions PXA-B, PXA-G, and PXA-R may respectively correspond to pixels. The pixel defining films PDL may divide the light-emitting elements LED.

The light-emitting regions PXA-R, PXA-G, and PXA-B may be classified into multiple groups according to the color of light provided by the light control members CCP1, CCP2, and CCP3. Specifically, the light-emitting regions PXA-R, PXA-G, and PXA-B may be classified into multiple groups according to the color of the first to third color light obtained by converting the first color light provided from the light-emitting layer EML while passing through the light control members CCP1, CCP2, and CCP3. In the display device DD according to an embodiment illustrated in FIGS. 3 and 4, three light-emitting regions PXA-R, PXA-G, and PXA-B respectively emitting red light, green light, and blue light are illustrated. For example, the display device DD according to an embodiment may include a red light-emitting region PXA-R, a green light-emitting region PXA-G, and a blue light-emitting region PXA-B that are distinct from each other.

The light-emitting regions PXA-R, PXA-G, and PXA-B in the display device DD according to an embodiment may be arranged in a stripe shape. Referring to FIG. 3, multiple red light-emitting regions PXA-R, multiple green light-emitting regions PXA-G, and multiple blue light-emitting regions PXA-B may be each aligned along the second direction axis DR2. The light-emitting regions may be alternately arranged in the order of the red light-emitting region PXA-R, the green light-emitting region PXA-G, and the blue light-emitting region PXA-B along the first direction axis DR1.

FIGS. 3 and 4 illustrate that areas of the light-emitting regions PXA-R, PXA-G, and PXA-B are all similar, but an embodiment of the disclosure is not limited thereto. For example, the areas of the light-emitting regions PXA-R, PXA-G, and PXA-B may be different from each other depending on the wavelength range of the emitted light. The areas of the light-emitting regions PXA-R, PXA-G, and PXA-B may mean areas as viewed on a plane defined by the first direction axis DR1 and the second direction axis DR2.

An arrangement of the light-emitting regions PXA-R, PXA-G, and PXA-B is not limited to that illustrated in FIG. 3, and an order, in which the red light-emitting region PXA-R, the green light-emitting region PXA-G, and the blue light-emitting region PXA-B are arranged, may be provided in various combinations according to the characteristics of display quality required for the display device DD. For example, the arrangement of the light-emitting regions PXA-R, PXA-G, and PXA-B may be a PENTILE® arrangement or diamond arrangement form.

The areas of the light-emitting regions PXA-R, PXA-G, and PXA-B may be different from each other. For example, in an embodiment, the area of the green light-emitting region PXA-G may be smaller than the area of the blue light-emitting region PXA-B, but an embodiment of the disclosure is not limited thereto.

The anti-reflection member AR may be a layer having low reflectance to block external light. The anti-reflection member AR may include multiple layers having different refractive indices, and thus block external light through destructive interference. The anti-reflection member AR will be described later in more detail.

Figure 5:
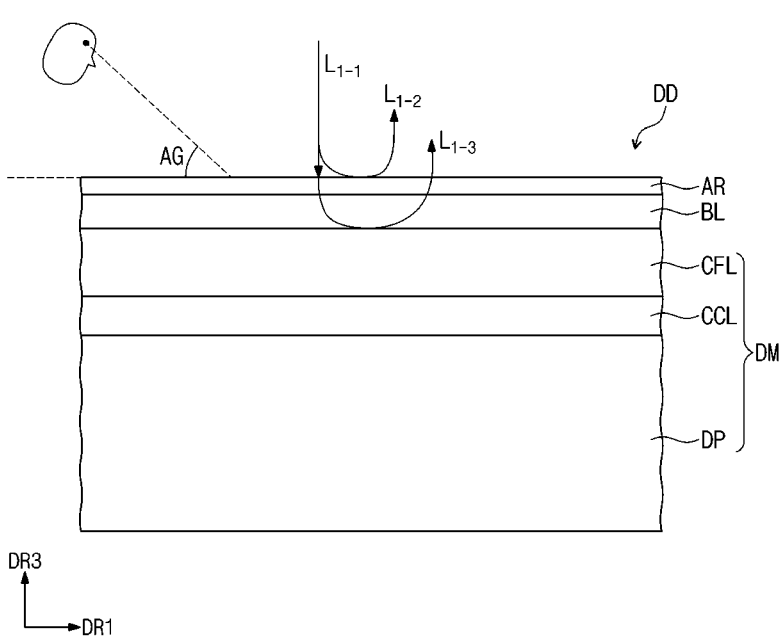
FIG. 5 is a schematic cross-sectional view schematically illustrating a display device according to an embodiment.
Figure 6:
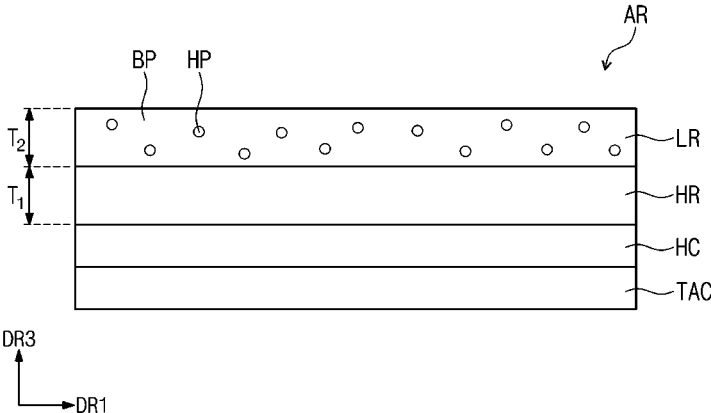
FIG. 6 is a schematic cross-sectional view of an anti-reflection member according to an embodiment.

FIG. 5 is a schematic cross-sectional view schematically illustrating a display device according to an embodiment. FIG. 6 is a schematic cross-sectional view of an anti-reflection member according to an embodiment.

Referring to FIGS. 5 and 6, the anti-reflection member AR may include a base layer TAC, a hard coating layer HC, a first optical layer HR, and a second optical layer LR. The anti-reflection member AR may be directly disposed on top of the display module DM. However, an embodiment of the disclosure is not limited thereto, and an adhesive layer (not shown) may be disposed between the anti-reflection member AR and the display module DM.

Referring to FIG. 5, first light $L_{1\text{-}1}$ may be external light incident from the anti-reflection member AR toward the display module DM. The first light $L_{1\text{-}1}$ may be partially reflected from the surface of the anti-reflection member AR, and the remainder of the first light $L_{1\text{-}1}$ may transmit the anti-reflection member AR. In case that the amount of second light $L_{1\text{-}2}$ which is partially reflected from the surface of the anti-reflection member AR is controlled, the amount of third light $L_{1\text{-}3}$ which is transmitted through the anti-reflection member AR and reflected from the surface of the display module DM may be controlled. The color, viewed by a user, of the reflected light incident on and reflected by the display device DD may be determined by a ratio of the amount of the second light $L_{1\text{-}2}$ and the amount of the third light $L_{1\text{-}3}$. For example, the color of the reflected light viewed by the user may be determined by the SCE (Specular Component Excluded) reflected light of the display module DM.

The anti-reflection member AR may have a Specular Component Included (SCI) reflectance of about 4% to about 7% with respect to light having a wavelength of about 350 nm or more and less than about 370 nm. As the SCI reflectance of the anti-reflection member AR with respect to light having a wavelength of about 350 nm or more and less than about 370 nm is greater, light, of the first light $L_{1\text{-}1}$, having a wavelength of about 350 nm or more and less than about 370 nm may have a greater proportion reflected by the anti-reflection member AR via the same path as the second light $L_{1\text{-}2}$, and a smaller proportion transmitted through the anti-reflection member AR and incident on the display module DM via the same path as the third light $L_{1\text{-}3}$. As a result, the amount of light having a wavelength of about 350 nm or more and less than about 370 nm reflected from the display module DM may be reduced.

In case that the anti-reflection member AR has an SCI reflectance of about 4% to about 7% with respect to light having a wavelength of about 350 nm or more and less than about 370 nm, the color of the reflected light viewed by the user in a state in which the power of the display device DD is turned off may be neutral black. In case that the color of the reflected light viewed by the user in a state in which the power of the display device DD is turned off is neutral black, the interference of the reflected light on an image generated in case that the power of the display device DD is turned on may be reduced, and thus the display quality of the display device DD may be improved.

The anti-reflection member AR may have an SCI reflectance of about 0% to about 0.3% with respect to light having a wavelength of about 450 nm to about 470 nm. In case that the SCI reflectance of the anti-reflection member AR with respect to light having a wavelength of about 450 nm to about 470 nm exceeds about 0.3%, the color of the reflected light viewed by a user in case that the power of the display device DD is turned off may not be realized as neutral black, and thus the display quality of the display device DD may be deteriorated.

The anti-reflection member AR may have an SCI reflectance of about 0% to about 0.2% with respect to light having a wavelength of about 540 nm to about 560 nm. In case that the SCI reflectance of the anti-reflection member AR with respect to light having a wavelength of 540 nm to about 560 nm exceeds about 0.2%, the anti-reflection function of the anti-reflection member AR may be weakened.

The anti-reflection member AR may have an SCI reflectance of about 0% to about 0.6% with respect to light having a wavelength of about 710 nm to about 730 nm. In case that the SCI reflectance of the anti-reflection member AR with respect to light having a wavelength of about 710 nm to about 730 nm is about 0% to about 0.6%, it is possible to improve a phenomenon in which the reflected light is viewed as reddish by the user in a power-off state of the display device DD in case that the user sees the display device DD at a viewing angle AG of about 10 to about 60 degrees.

Referring to FIG. 6, the base layer TAC may be disposed adjacent to the display module DM. The base layer TAC may include an organic material having high strength and excellent planarization characteristics. For example, the base layer TAC may include triacetylcellulose. The base layer TAC may be disposed on the display module DM to provide a flat top surface.

The hard coating layer HC may be disposed on the base layer TAC. The hard coating layer HC may provide durability to the anti-reflection member AR. The hard coating layer HC may have a refractive index of about 1.3 to about 1.6.

The first optical layer HR may be disposed on the hard coating layer HC. The first refractive index of the first optical layer HR may be greater than the second refractive index of the second optical layer LR. The first optical layer HR may include a metal oxide. For example, the first optical layer HR may include zirconium oxide ($ZrO_x$). However, an embodiment of the disclosure is not limited thereto, and any materials having the first refractive index greater than the second refractive index may be used without limitation for the material of the first optical layer HR.

The second optical layer LR may be disposed on the first optical layer HR. The second refractive index of the second optical layer LR may be smaller than the first refractive index of the first optical layer HR. The second optical layer LR and the first optical layer HR may include different materials. The second optical layer LR may include a material having a lower refractive index than that of the first optical layer HR.

The second optical layer LR may include a base portion BP and inorganic particles HP dispersed in the base portion BP. The base portion BP may include an organic material that may be cured. For example, the base portion BP may be formed of a silicone resin. However, an embodiment of the disclosure is not limited thereto.

The inorganic particles HP may include hollow silica. The hollow silica may have a spherical shape. The size of the hollow silica may be uniform. However, an embodiment of the disclosure is not limited thereto. For example, the size of the hollow silica may be non-uniform. The average diameter of the hollow silica may be about 15 μm to about 45 μm. In case that the average diameter of the hollow silica is less than 15 about μm, anti-reflection characteristics may be weakened, and in case that the average diameter of the hollow silica exceeds about 45 μm, transmittance characteristics may be weakened.

The first optical layer HR may have a refractive index of about 1.4 to about 1.7. The second optical layer LR may have a refractive index of about 1.0 to about 1.3. The first optical layer HR may have a thickness $T_1$ of about 80 μm to about 90 μm. The second optical layer LR may have a thickness $T_2$ of about 90 μm to about 100 μm. In case that the first optical layer HR has a refractive index of about 1.4 to 1.7, the second optical layer LR has a refractive index of about 1.0 to about 1.3, the first optical layer HR has a thickness $T_1$ of about 80 μm to about 90 μm, and the second optical layer LR has a thickness $T_2$ of about 90 μm to about 100 μm, the reflected light may be viewed by the user as neutral black.

The sum of the thickness $T_1$ of the first optical layer HR and the thickness $T_2$ of the second optical layer LR may be about 190 μm or less. In case that the sum of the thickness $T_1$ of the first optical layer HR and the thickness $T_2$ of the second optical layer LR exceeds about 190 μm or more, the SCI reflectance of the anti-reflection member with respect to light of about 540 nm to about 560 nm may increase, and the anti-reflection function of the anti-reflection member AR may be weakened.

In the anti-reflection member AR according to an embodiment, the reflectance of the anti-reflection member AR may be controlled by setting the thickness $T_1$ of the first optical layer HR and the thickness $T_2$ of the second optical layer LR to be greater than the thickness of a typical anti-reflection member. For example, in the anti-reflection member AR according to an embodiment, the thickness $T_1$ of the first optical layer HR may be controlled to be about 10% greater than the thickness of a typical first optical layer, and the thickness $T_2$ of the second optical layer LR may be controlled to be about 9% greater than the thickness of a typical second optical layer. In the anti-reflection member AR according to an embodiment, by controlling the thickness $T_1$ of the first optical layer HR and the thickness $T_2$ of the second optical layer LR to be longer, the anti-reflection member may have high SCI reflectance with respect to blue light and low SCI reflectance with respect to green light. In case that the anti-reflection member AR has high SCI reflectance with respect to blue light, the amount of blue light that is transmitted through the anti-reflection member AR and incident on the display module DM may decrease, and thus the amount of blue light reflected from the display module DM may decrease. In case that the anti-reflection member AR has low SCI reflectance with respect to the green light, the amount of green light reflected from the anti-reflection member AR may decrease. Accordingly, the color of the reflected light viewed by the user in a power-off state of the display device DD may be exhibited as neutral black by controlling the reflectance of light in different wavelength ranges.

Figure 7:
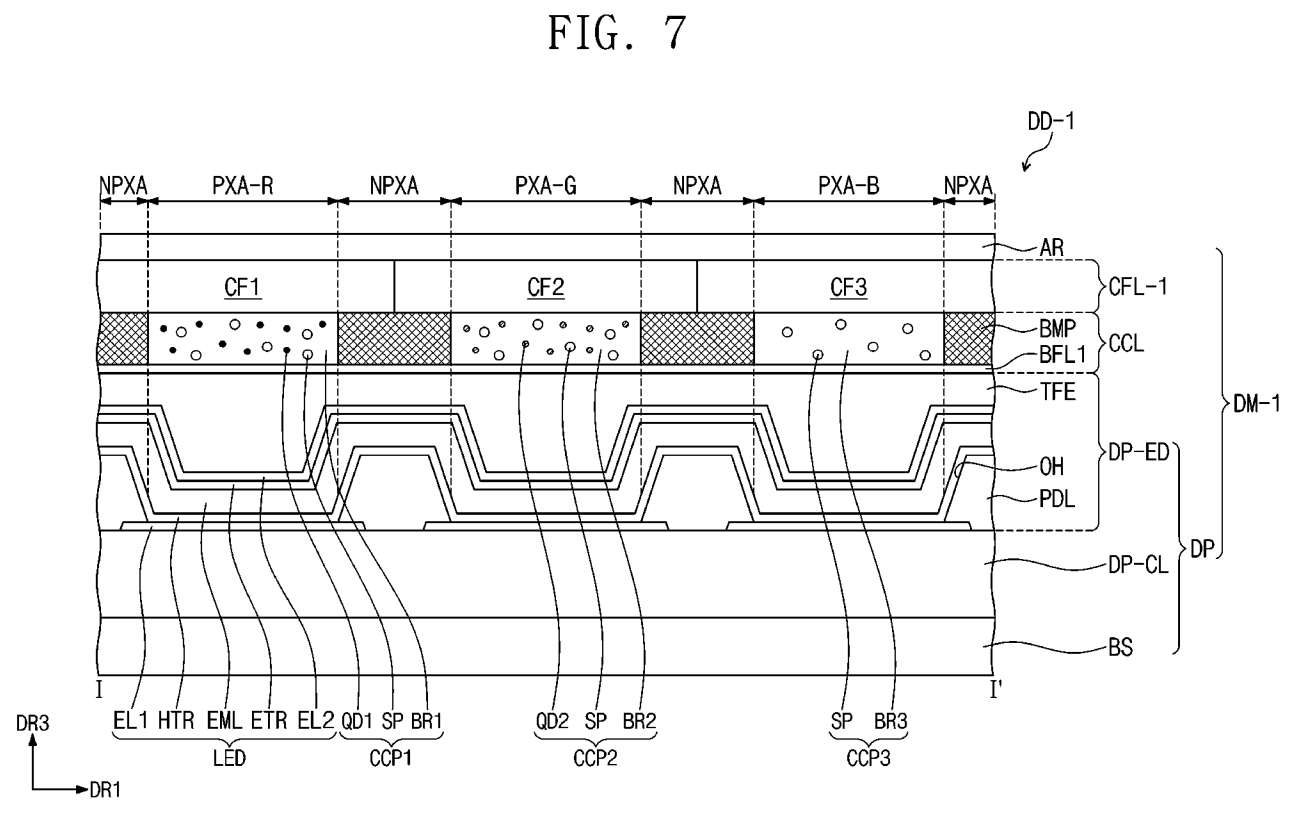

FIG. 7 is a cross-sectional view of a display device according to an embodiment. Hereinafter, in the description of the display device according to an embodiment illustrated in FIG. 7, duplicate description made with reference to FIGS. 1 to 6 will not be presented again, and description will be made focusing on differences.

A display device DD-1 according to an embodiment illustrated in FIG. 7 is different from the display device DD of FIG. 4 in that the base substrate BL is not included and a color filter layer CFL-1 is directly disposed on the light control layer CCL.

Referring to FIG. 7, in the display device DD-1 according to an embodiment, the color filter layer CFL-1 may be directly disposed on the light control layer CCL. The color filter layer CFL-1 may include a first filter CF1, a second filter CF2, and a third filter CF3. The color filter layer CFL-1 may not include a light blocking portion BM (FIG. 4). The anti-reflection member AR may be directly disposed on the color filter layer CFL-1. For example, the anti-reflection member AR may be directly disposed on the display module DM that does not include the base substrate BL (FIG. 4). The light control layer CCL, the color filter layer CFL-1, and the anti-reflection member AR may be formed through a continuous process.

Figure 8A:
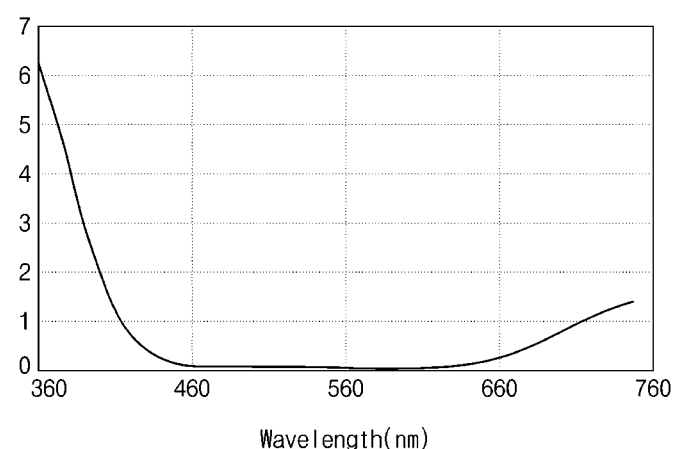
FIG. 8A is a graph showing the SCI reflectance of an anti-reflection member according to Example.
Figure 8B:
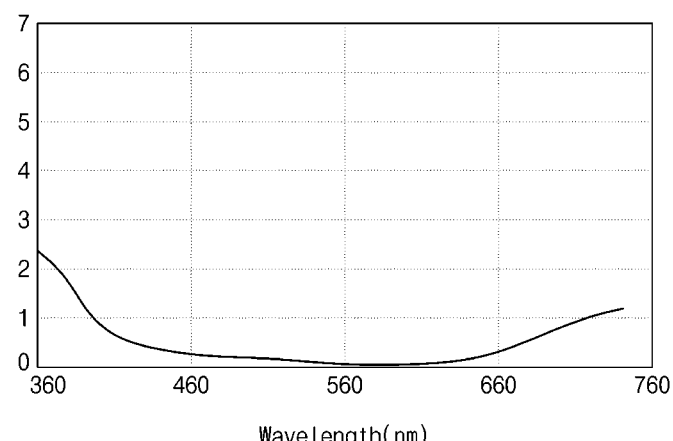
FIG. 8B is a graph showing the SCI reflectance of an anti-reflection member according to Comparative Example.
Figure 9A:
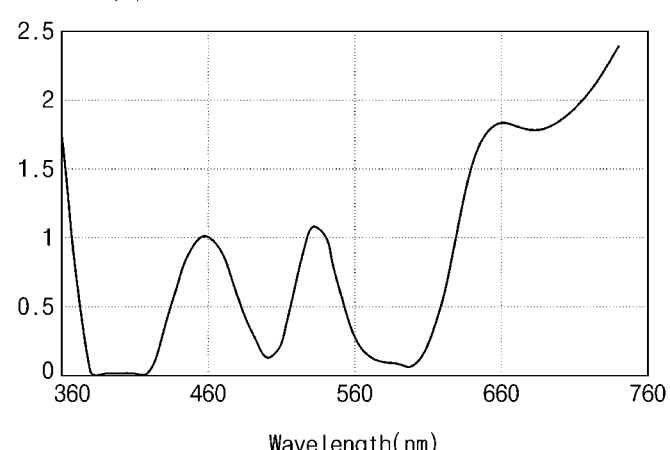
FIG. 9A is a graph showing the SCE reflectance of a display device including an anti-reflection member according to Example.
Figure 9B:
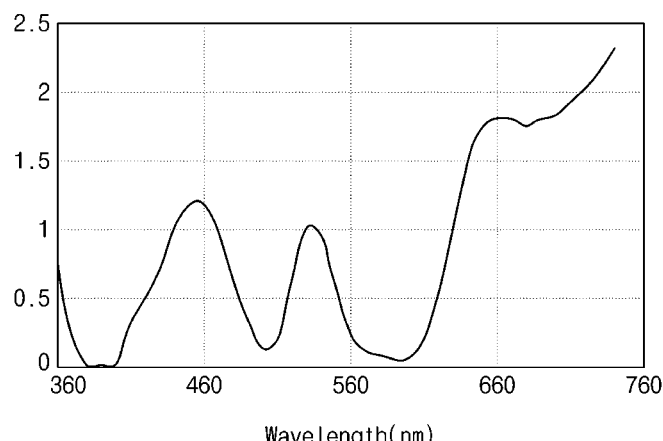
FIG. 9B is a graph showing the SCE reflectance of a display device including an anti-reflection member according to Comparative Example.

FIG. 8A is a graph showing the SCI reflectance of an anti-reflection member according to Example. FIG. 8B is a graph showing the SCI reflectance of an anti-reflection member according to Comparative Example. FIG. 9A is a graph showing the SCE reflectance of a display device including an anti-reflection member according to Example. FIG. 9B is a graph showing the SCE reflectance of a display device including an anti-reflection member according to Comparative Example. The SCI reflectance of the anti-reflection member shown in FIGS. 8A and 8B was measured after the anti-reflection member AR (FIG. 6) described in FIG. 6 was disposed on a black plate. The SCE reflectance of the display device shown in FIGS. 9A and 9B was obtained by measuring the SCE reflectance of the display device DD described in FIG. 4. The anti-reflection members according to Examples described in FIGS. 8A and 9A each have an SCI reflectance of about 4% to about 7% with respect to light having a wavelength of about 350 nm to about 370 nm. The anti-reflection members according to Comparative Examples described in FIGS. 8B and 9B have the same structure as that of Example, except that the SCI reflectance is less than about 4% with respect to light having a wavelength of about 350 nm to about 370 nm.

Referring to FIGS. 8A and 8B, it may be seen that the anti-reflection member of Example has a higher SCI reflectance with respect to light having a wavelength of about 350 nm to about 370 nm than the anti-reflection member of Comparative Example. Referring to FIGS. 9A and 9B, it may be seen that the display device of Example has a higher SCE reflectance with respect to light having a wavelength of about 350 nm to about 370 nm than the display device of Comparative Example.

In Table 1, SCE color coordinates of reflected light of each of the display device of Example (DD, FIG. 5) and the display device of Comparative Example were measured and shown. The SCE color coordinates of the reflected light of the display devices were obtained by measuring the SCE color coordinates of the reflected light in a power-off state of the display device.

TABLE 1

| Division | | Example | Comparative Example |
|---|---|---|---|
| SCE color coordinate | X | 0.305 | 0.288 |
| SCE color coordinate | Y | 0.284 | 0.246 |

As the SCE color coordinates are closer to X=0.310, Y=0.330, the reflected light may be viewed, by the user, as being closer to neutral black. Referring to Table 1, the SCE color coordinates of Example are X=0.305 and Y=0.284, and the SCE color coordinates of Comparative Example are X=0.288, Y=0.246. Accordingly, the reflected light of the display device DD (FIG. 4) according to Example may be viewed by the user as being closer to neutral black as compared to the reflected light from the display device of Comparative Example.

Figure 10:
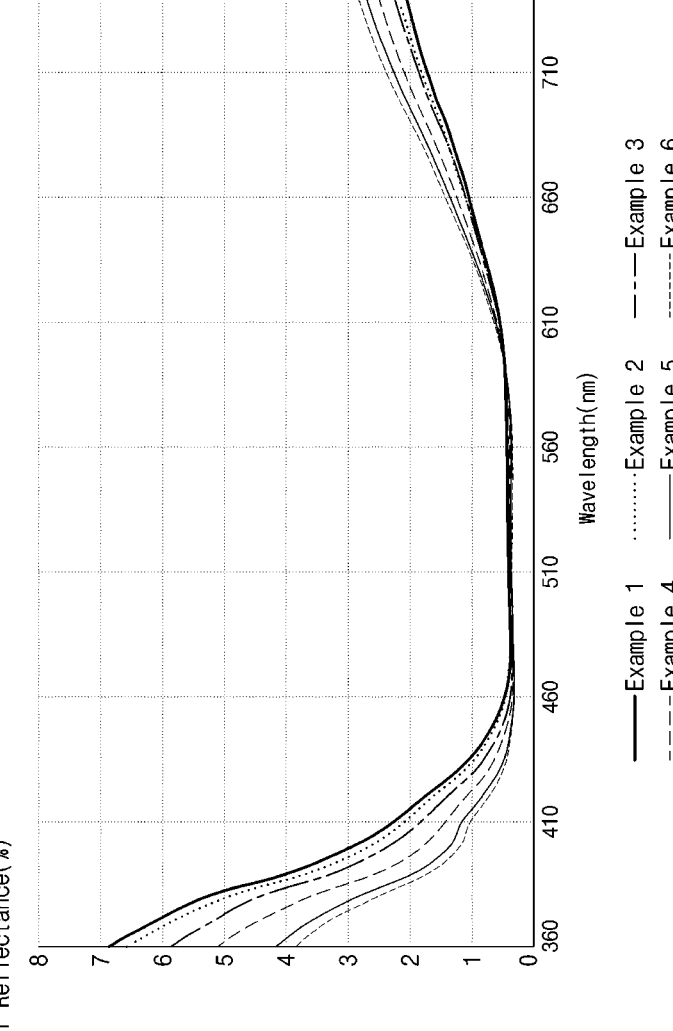
FIG. 10 is a graph showing an SCI reflectance of an anti-reflection member according to Example based on a wavelength of light.

FIG. 10 is a graph showing an SCI reflectance of an anti-reflection member according to Example based on a wavelength of light.

Referring to FIG. 10, the SCI reflectance of each of the anti-reflection members (AR, FIG. 5) according to Examples 1 to 6 based on the wavelength of light were shown on the graph. The anti-reflection members AR (FIG. 5) of Examples 1 to 6 all have different SCI reflectances within a range of about 4% to about 7% with respect to light having a wavelength of about 350 nm to about 370 nm. The anti-reflection members according to Examples 1 to 6 have lower values of SCI reflectance in a descending order with respect to light having a wavelength of about 350 nm to about 370 nm. In the display device DD (FIG. 5) including the anti-reflection members AR (FIG. 5) of Examples 1 to 6, the SCE color coordinates of the reflected light are shown in Table 2.

TABLE 2

| | SCE color coordinate | |
|---|---|---|
| Division | X | Y |
| Example 1 | 0.318 | 0.327 |
| Example 2 | 0.315 | 0.321 |
| Example 3 | 0.309 | 0.312 |
| Example 4 | 0.300 | 0.301 |
| Example 5 | 0.293 | 0.289 |
| Example 6 | 0.290 | 0.284 |

It may be seen that as the SCI reflectance of the anti-reflection member AR (FIG. 5) with respect to light having a wavelength of about 350 nm to about 370 nm increases, each of the X value and the Y value of the SCE color coordinates increases. Accordingly, it may be seen that the SCE color coordinates value may be controlled by adjusting the SCI reflectance of the anti-reflection member AR (FIG. 5) with respect to light having a wavelength of about 350 nm to about 370 nm.

Figure 11A:
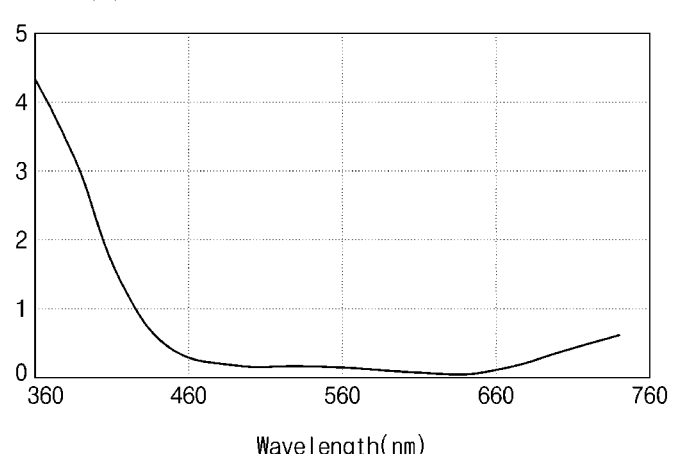
FIG. 11A is a graph showing an SCI reflectance of an anti-reflection member according to Example based on a wavelength of light.
Figure 11B:
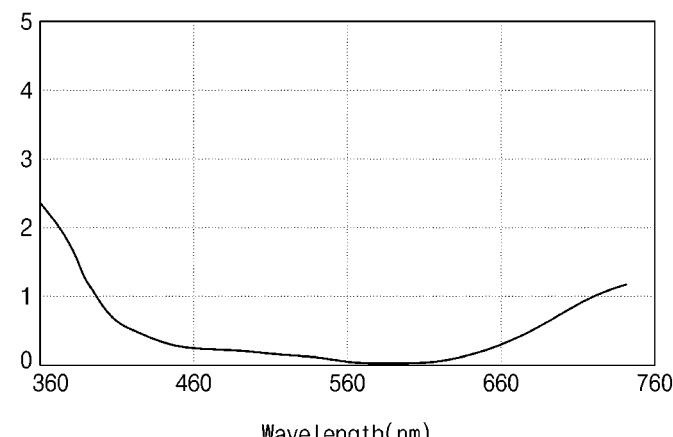
FIG. 11B is a graph showing an SCI reflectance of an anti-reflection member according to Comparative Example based on a wavelength of light.
Figure 12A:
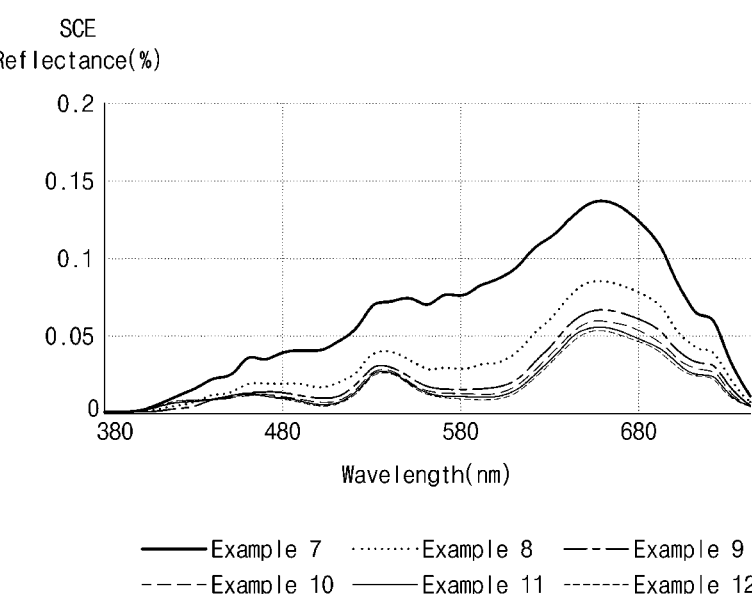
FIG. 12A is a graph showing an SCE reflectance based on a viewing angle in a display device including an anti-reflection member according to Example.
Figure 12B:
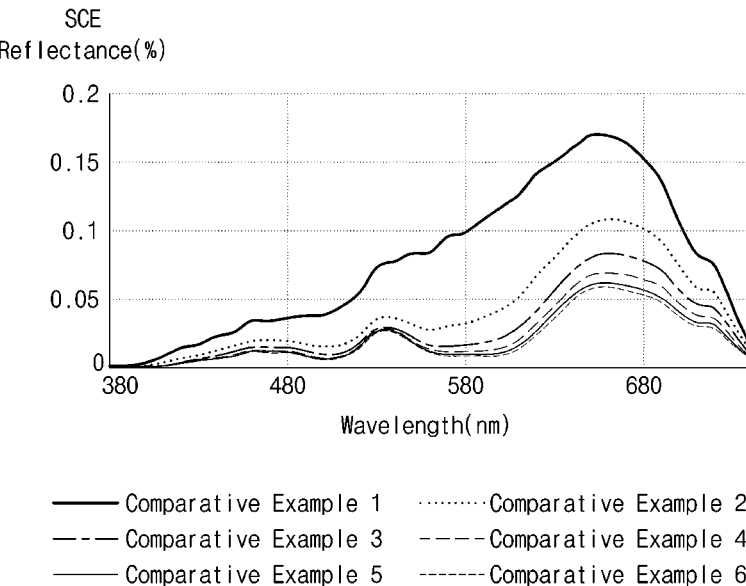
FIG. 12B is a graph showing an SCE reflectance based on a viewing angle in a display device including an anti-reflection member according to Comparative Example.

FIG. 11A is a graph showing an SCI reflectance of an anti-reflection member according to Example based on a wavelength of light. FIG. 11B is a graph showing an SCI reflectance of an anti-reflection member according to Comparative Example based on a wavelength of light. FIG. 12A is a graph showing an SCE reflectance based on a wavelength of light in a display device including an anti-reflection member according to Example. FIG. 12B is a graph showing an SCE reflectance based on a wavelength of light in a display device including an anti-reflection member according to Comparative Example. The SCI reflectance of each of the anti-reflection members shown in FIGS. 11A and 11B was measured after the anti-reflection member AR (FIG. 6) described in FIG. 6 was disposed on a black plate. The SCI reflectance of each of the display devices shown in FIGS. 12A and 12B was obtained by measuring the SCE reflectance of the display device DD described in FIG. 5. The anti-reflection members according to Examples described in FIGS. 11A and 12A each have an SCI reflectance of about 0.6% or less with respect to light having a wavelength of about 710 nm to about 730 nm. The anti-reflection members according to Comparative Examples described in FIGS. 11B and 12B have the same structure as that of Example, except that the SCI reflectance with respect to light having a wavelength of about 710 nm to about 730 nm exceeds about 0.6%.

Referring to FIGS. 11A and 11B, it may be seen that the anti-reflection member AR (FIG. 5) of Example has a smaller SCI reflectance with respect to light having a wavelength of about 710 nm to about 730 nm than the anti-reflection member of Comparative Example.

Referring to FIGS. 12A, and 5, in Examples 7 to 12, shown are the SCE reflectance of the display device DD at a position where the viewing angle AG (FIG. 5) of the display device DD is 60 degrees, 50 degrees, 40 degrees, 30 degrees, 20 degrees, and 10 degrees. Referring to FIG. 12B, in Comparative Examples 1 to 6, shown are the SCE reflectance for reflected light at a position where the viewing angle AG (FIG. 5) is 60 degrees, 50 degrees, 30 degrees, 20 degrees, and 10 degrees.

In FIGS. 12A and 12B, comparing Examples 7 to 12 with Comparative Examples 1 to 6 respectively, it may be seen that Examples 7 to 12 have a smaller SCE reflectance with respect to light having a wavelength of about 710 nm to about 730 nm than Comparative Examples 1 to 6. Consequently, it is possible to reduce a phenomenon in which the reflected light is viewed as reddish by the user in case that the display device DD (FIG. 5) including the anti-reflection member AR (FIG. 5) having an SCI reflectance of about 0.6% or less with respect to light having a wavelength of about 710 nm to about 730 nm is viewed from the side.

The electronic device according to an embodiment may include an anti-reflection member having a relatively high reflectance with respect to light having a wavelength range of about 350 nm to about 370 nm, and therefore the color of reflected light reflected from the electronic device may be controlled to be neutral black. In case that the color of the reflected light is controlled to be neutral black, interference between the image provided from the electronic device and the reflected light may be minimized. As a result, the display quality of the electronic device according to an embodiment may be improved.

An anti-reflection member of an electronic device according to an embodiment may have a high reflectance with respect to short-wavelength light and may thus have excellent display quality.

Although the embodiments of the disclosure have been described, it is to be understood that the disclosure should not be limited to these embodiments but various changes and modifications can be made by one ordinary skilled in the art within the spirit and scope of the disclosure as hereinafter claimed.

What is claimed is:

1. An electronic device comprising:

a display module; and an anti-reflection member disposed on the display module, the anti-reflection member having a Specular Component Included (SCI) reflectance in a range of 4% to 7% with respect to light having a wavelength in a range of 350 nm to 370 nm, wherein the anti-reflection member includes a base layer, a hard coating layer disposed on the base layer, a first optical layer disposed on the hard coating layer, the first optical layer having a first refractive index, a second optical layer disposed on the first optical layer, the second optical layer having a second refractive index that is smaller than the first refractive index;

wherein a thickness of the first optical layer is smaller than a thickness of the second optical layer;

wherein the first optical layer has a thickness in a range of 80 μm to 90 μm, and the second optical layer has a thickness in a range of 90 μm to 100 μm; and wherein the first refractive index is in a range of 1.4 to 1.7, and the second refractive index is in a range 1.0 to 1.3.

2. The electronic device of claim 1, wherein a sum of the thickness of the first optical layer and the thickness of the second optical layer is in a range of 170 μm to 190 μm.

3. The electronic device of claim 1, wherein the anti-reflection member has an SCI reflectance in a range of 0% to 0.3% with respect to light having a wavelength in a range of 450 nm to 470 nm.

4. The electronic device of claim 1, wherein the anti-reflection member has an SCI reflectance in a range of 0% to 0.2% with respect to light having a wavelength in a range of 540 nm to 560 nm.

5. The electronic device of claim 1, wherein the anti-reflection member has an SCI reflectance in a range of 0% to 0.6% with respect to light having a wavelength in a range of 710 nm to 730 nm.

6. The electronic device of claim 1, wherein the first optical layer includes zirconium oxide ($ZrO_x$).

7. The electronic device of claim 1, wherein the second optical layer includes hollow silica.

8. An electronic device comprising:

a base substrate;

a circuit layer disposed on the base substrate;

a light-emitting element layer disposed on the circuit layer;

an encapsulation layer disposed on the light-emitting element layer;

a light control layer including at least one light control member, the light control layer disposed on the encapsulation layer and the at least one light control member including quantum dots;

a color filter layer disposed on the light control layer; and an anti-reflection member disposed on the light control layer, the anti-reflection member having a Specular Component Included (SCI) reflectance in a range of 4% to 7% with respect to light having a wavelength in a range of 350 nm to 370 nm, wherein the anti-reflection member comprises:

a base layer;

a hard coating layer disposed on the base layer;

a first optical layer disposed on the hard coating layer, the first optical layer having a first refractive index; and a second optical layer disposed on the first optical layer, the second optical layer having a second refractive index that is smaller than the first refractive index;

wherein the first refractive index is in a range of 1.4 to 1.7, and the second refractive index is in a range 1.0 to 1.3; and wherein a thickness of the first optical layer is smaller than a thickness of the second optical layer, the first optical layer has a thickness in a range of 80 μm to 90 μm, and the second optical layer has a thickness in a range of 90 μm to 100 μm.

9. The electronic device of claim 8, wherein the first optical layer includes zirconium oxide ($ZrO_x$), and the second optical layer includes hollow silica.

10. The electronic device of claim 8, wherein the anti-reflection member has an SCI reflectance in a range of 0% to 0.3% with respect to light having a wavelength in a range of 450 nm to 470 nm.

11. The electronic device of claim 8, wherein the anti-reflection member has an SCI reflectance in a range of 0% to 0.2% with respect to light having a wavelength in a range of 540 nm to 560 nm.

12. The electronic device of claim 8, wherein the anti-reflection member has an SCI reflectance in a range of 0% to 0.6% with respect to light having a wavelength in a range of 710 nm to 730 nm.

13. The electronic device of claim 8, wherein the light-emitting element layer comprises a first electrode, a hole transport region, a light-emitting layer, an electron transport region, and a second electrode that are sequentially stacked each other.

14. The electronic device of claim 13, wherein the light-emitting layer emits blue light.

15. The electronic device of claim 14, wherein the light control layer comprises:

a first light control member that converts the blue light into red light;

a second light control member that converts the blue light into green light; and a third light control member that transmits the blue light.

* * * * *